United States Patent
Yoon

[11] Patent Number: 5,900,006
[45] Date of Patent: May 4, 1999

[54] MEDIAN FILTERING METHOD AND APPARATUS USING A PLURALITY OF PROCESSING ELEMENTS

[75] Inventor: Sung-Wook Yoon, Seoul, Rep. of Korea

[73] Assignee: Daewoo Electronics Co., Ltd., Seoul, Rep. of Korea

[21] Appl. No.: 08/780,079

[22] Filed: Dec. 23, 1996

[51] Int. Cl.⁶ .................................................... G06F 17/10
[52] U.S. Cl. ................ 708/202; 364/724.19; 364/724.01
[58] Field of Search .................... 364/724.01, 724.19, 364/724.03, 724.014, 724.06, 715.013

[56] References Cited

U.S. PATENT DOCUMENTS

| | | | |
|---|---|---|---|
| 4,868,773 | 9/1989 | Coyle et al. | 364/724.01 |
| 5,138,567 | 8/1992 | Mehgardt | 364/724.01 |
| 5,144,568 | 9/1992 | Glover | 364/715.01 |
| 5,426,670 | 6/1995 | Leppanen et al. | 375/343 |
| 5,432,884 | 7/1995 | Kapanen et al. | 395/2.37 |
| 5,708,595 | 1/1998 | Connell | 364/715.01 |

Primary Examiner—Ayaz R. Sheikh
Assistant Examiner—Tim T. Vo
Attorney, Agent, or Firm—Anderson, Kill & Olick, P.C.

[57] ABSTRACT

An apparatus for median filtering a sequence of input values comprises (N+1) number of processing elements coupled in series for storing (N+1) number of input values included in a values group and providing a median value thereof, N being a positive even number, each of the processing elements having a value register for storing an input value, a first stored value in the first processing element being smaller than or equal to a second stored value in a second processing element and an (i)th stored value in an (i)th processing element being smaller than or equal to an (i+1)st stored value in an (i+1)st processing element; and an input for sequentially providing input values to the processing elements, an input value being provided to all the processing elements simultaneously.

15 Claims, 6 Drawing Sheets

| COUNT ARRAY (LO,CO) | SELECTION SIGNAL | UPDATED DATA |
|---|---|---|
| (0,0) | D | L |
| (0,0) | I | I |
| (0,0) | U | C |
| (0,1) | D | L |
| (0,1) | I | I |
| (0,1) | U | H |
| (1,0) | D | C |
| (1,0) | I | I |
| (1,0) | U | H |

FIG. 6
(PRIOR ART)

MEDIAN FILTERING METHOD AND APPARATUS USING A PLURALITY OF PROCESSING ELEMENTS

FIELD OF THE INVENTION

The present invention relates to a method and apparatus for median filtering an audio or video signal to eliminate an impulse noise component therein using a plurality of processing elements.

DESCRIPTION OF THE PRIOR ART

In general, an impulse noise component is often found in a video signal. The impulse noises in the video signal may have been produced due to a low signal/noise ratio associated with the broadcasting of FM signals via satellite as well as due to an electromagnetic wave interference at a receiver side thereof. The impulse noises in the FM signal may be produced by incongruously tracking an original frequency band of the FM signal being demodulated within the receiver. On the other hand, the impulse noises due to an electromagnetic interference may be caused by the electromagnetic waves produced from electric devices such as an electric motor and can take a band form having a single line or a number of lines.

Figure 6:
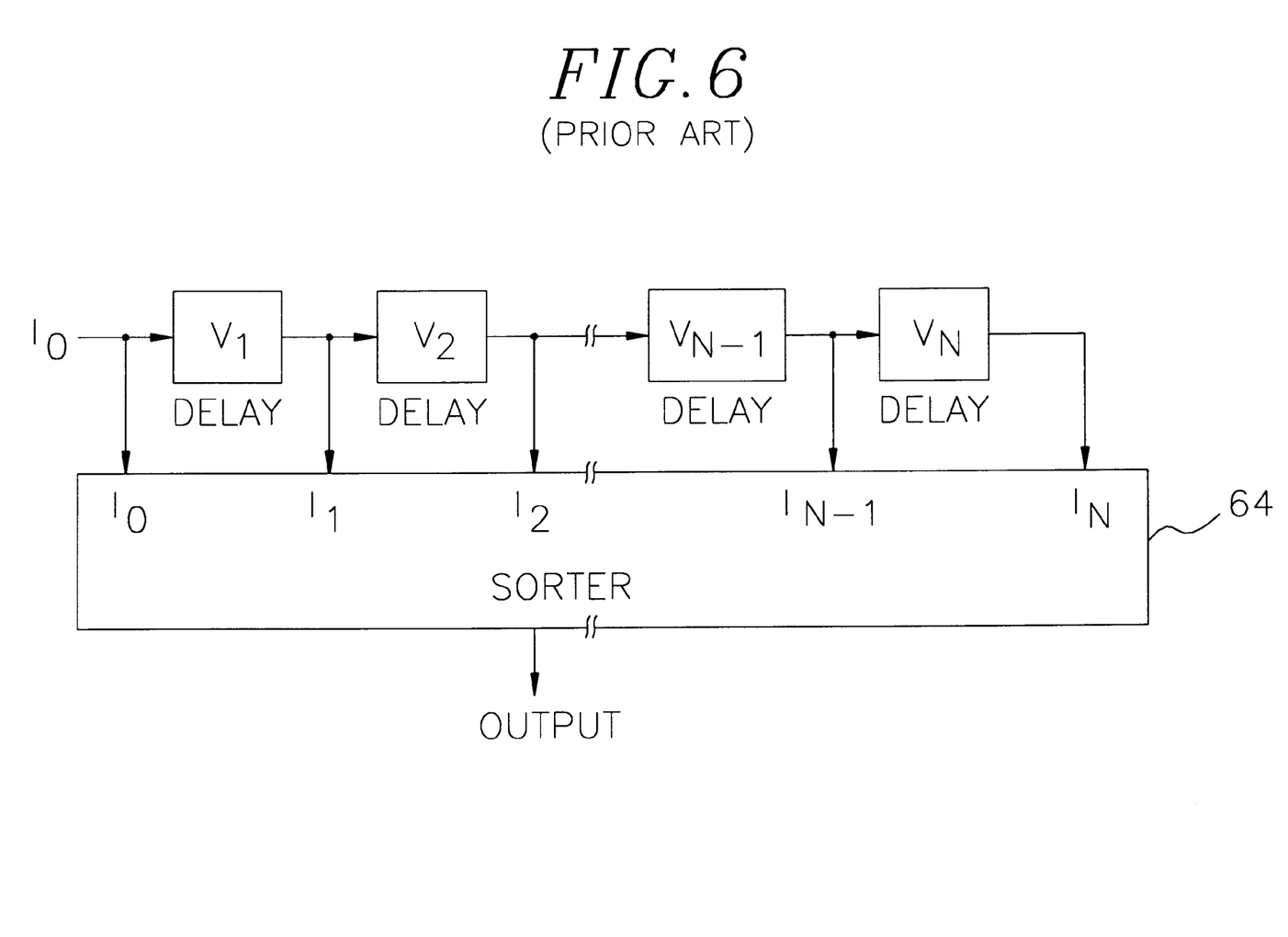
FIG. 6 presents a prior art median filter.

One of the proposed solutions for eliminating the impulse noises is to use a median filter. In FIG. 6, there is shown a block diagram of a conventional median filter. A series of input data is continuously supplied to an input port and each input data passes through a cascade of N delay elements $V_1$ to $V_N$, one input data to one element at a time, each input data being delayed at each delay element, N being a positive integer. When new input data $I_0$ is applied to the input port, each of N preceding input data $I_1$, to $I_N$ will be available as an output from each corresponding delay element at a time. A set of these input data $I_0$ to $I_N$ from the input port and the N delay elements $V_1$ to $V_N$ is supplied to a sorter 64 simultaneously, wherein the N+1 input data provided to the sorter 64 at a time represents the window size of a predetermined magnitude, i.e., a unit of data processing for calculating a median value. The sorter 64 rearranges the set of these input data $I_0$ to $I_N$ according to the order of their magnitude and a median value is selected and provided to an output port, wherein the median value represents an input data value corresponding to the median data in the newly arranged set.

When another new input data $I_A$ is applied to the input port, each input data held at each corresponding delay element is transferred to each corresponding next delay element in the series of the delay elements, i.e., $I_{N-1}$ held at $V_{N-1}$ being transferred to $V_N$, replacing $I_N$ previously held at $V_N$ and so on, thereby forming a new set of input data $I_A$, $I_0, \ldots, I_{N-1}$ including the new input data $I_A$. The new set of input data is fed to the sorter 64 and then rearranged once again according to the order of their magnitude, independent of the order of the data sorted in a former sorting procedure, to repeat the process of selecting a median value for the new set of input data. The need to repeat the process for selecting a median value increases as the size of the window increases. Since it takes a long time to carry out the conventional median filtering procedure as described above, the size of the window of the median filter for a high transmission rate of the input data will have to be small in order to achieve the median filtering procedure in real time. Consequently, it is rather difficult for a conventional median filter to accommodate a large or variable size of window in response to a high level of or variable impulse noises in the input data being filtered.

SUMMARY OF THE INVENTION

It is, therefore, a primary object of the invention to provide a method for median filtering a sequence of input values, wherein impulse noises in the input values can be efficiently reduced by using a plurality of processing elements, to thereby render it possible to process the input values in real time even if the window of the median filter is very large.

It is another object of the present invention to provide a method for median filtering a sequence of input values, which can easily accommodate a variation in the window size by adding or subtracting processing elements depending on the modularity of each processing element.

In accordance with the invention, there is provided a method for median filtering a sequence of input values wherein an input value is replaced by a median value for a values group which includes the input value to be replaced and N neighboring input values thereof, and the median filter includes (N+1) memory locations, N being a positive even integer, the method comprising the steps of:

(a) putting a first input value of the sequence in one of the memory locations and arbitrary values in the remaining memory locations as initial values thereof and assigning a count 1 to the first input value and counts 2 to (N+1) to the arbitrary values, respectively, thereby storing an input value and its associated count in each of the memory locations;

(b) receiving a next input value and finding a stored value associated with the count (N+1);

(c) arranging the next input value and the stored values other than the one associated with the count (N+1) in the order of their magnitude, thereby providing arranged values;

(d) incrementing an associated count for each of the stored values by 1 and assigning a count 1 to the next input value to thereby provide newly associated counts for the arranged values;

(e) storing the arranged values in said step (c) and their newly associated counts in the corresponding (N+1) memory locations in the order of their magnitude of the arranged values;

(f) repeating said steps (b) to (e) for the remaining input values included in the first (N+1) input values of the sequence to thereby store a first values group in the (N+1) memory locations;

(g) outputting a stored value in a predetermined memory location as a median value for the first values group;

(h) repeating said steps (b) to (e) for a next input value, thereby storing a next values group in the (N+1) memory locations;

(i) outputting a stored value in the predetermined memory location as a median value for the next values group; and (j) repeating said steps (h) and (i) for each of the subsequent input values in the sequence.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
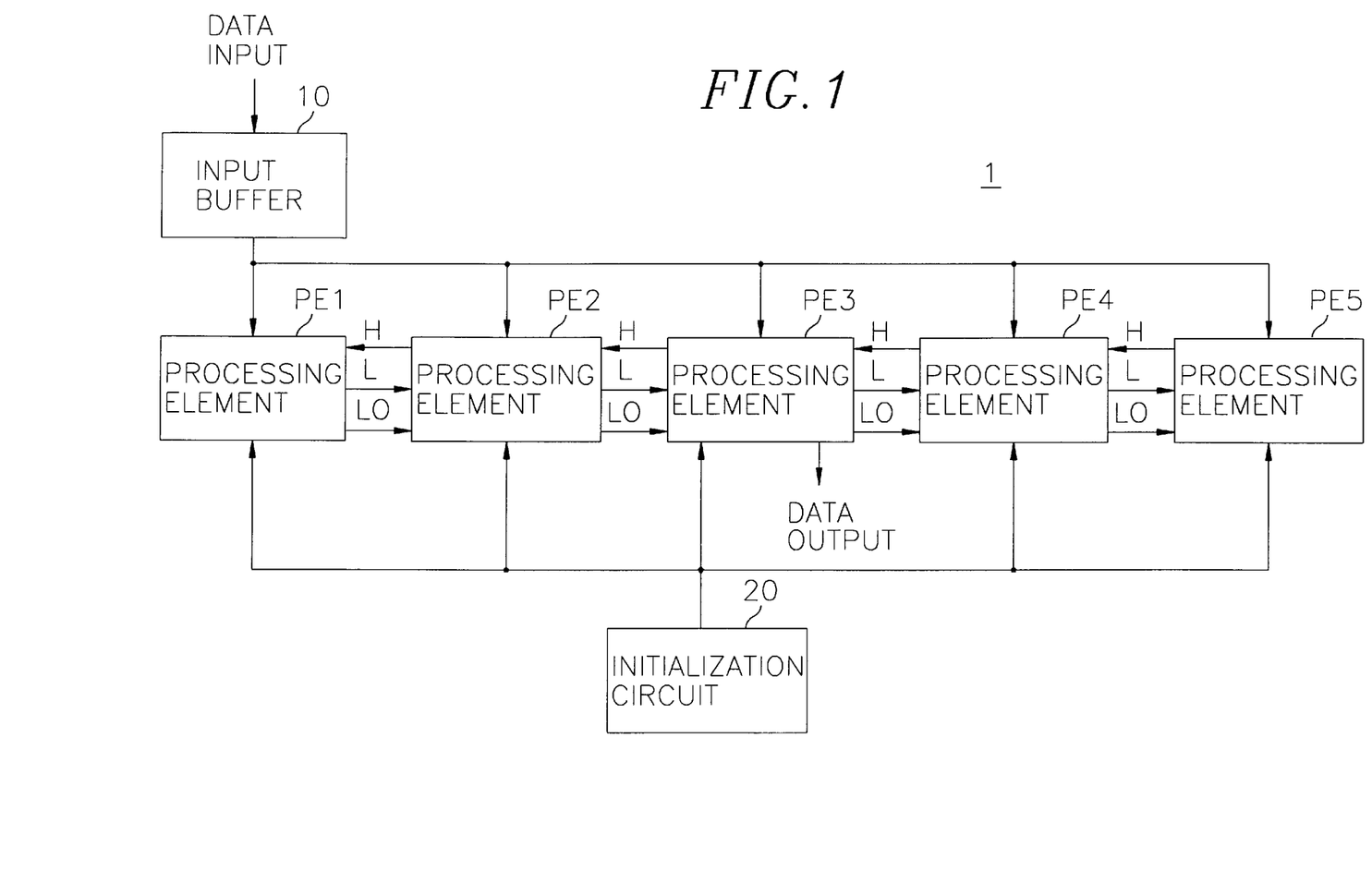
FIG. 1 represents a block diagram of an apparatus for median filtering a sequence of input values having 5 independent processing elements in accordance with the present invention.
Figure 5A:
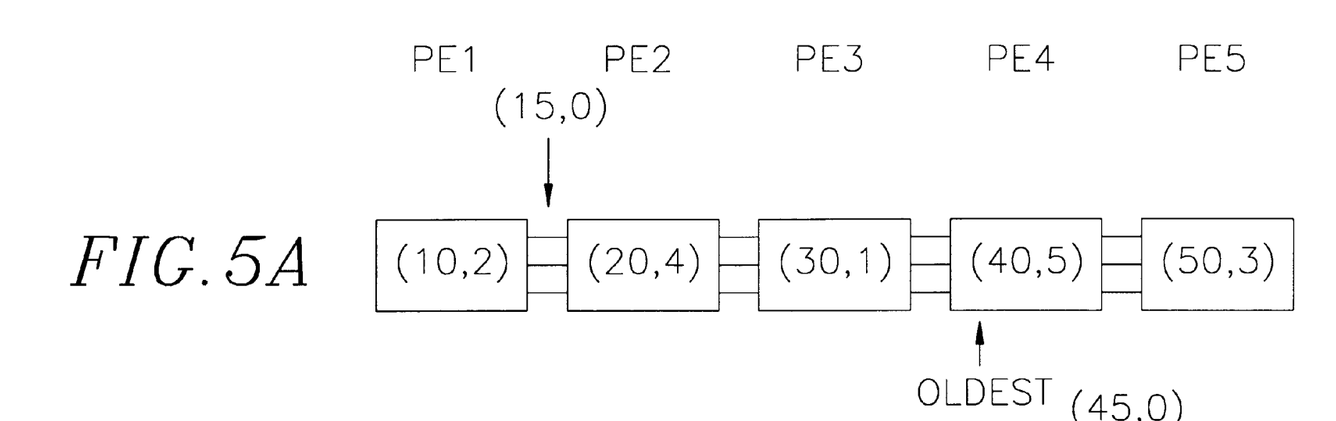
FIGS. 5A, 5B and 5C sequentially provide procedures for determining the median value for the cases corresponding to different locations of the oldest data when input values 15 and 45 are introduced.
Figure 5B:
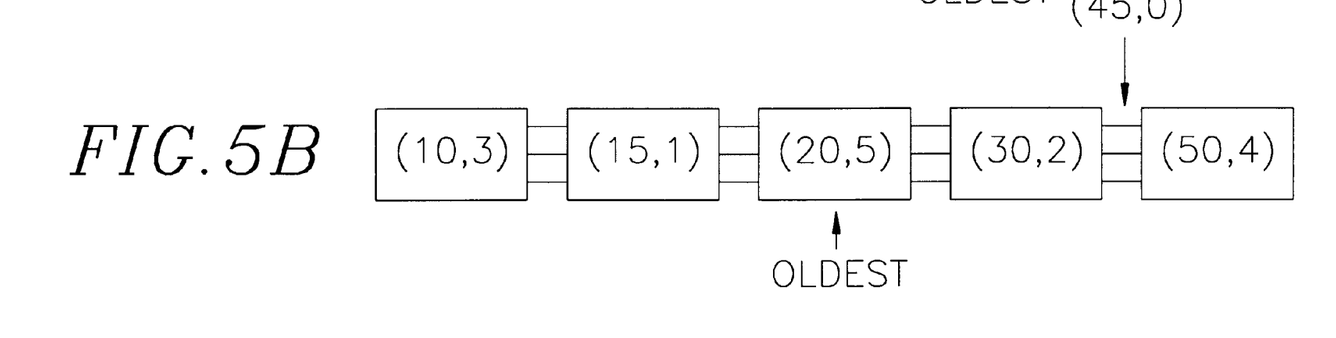
Figure 5C:
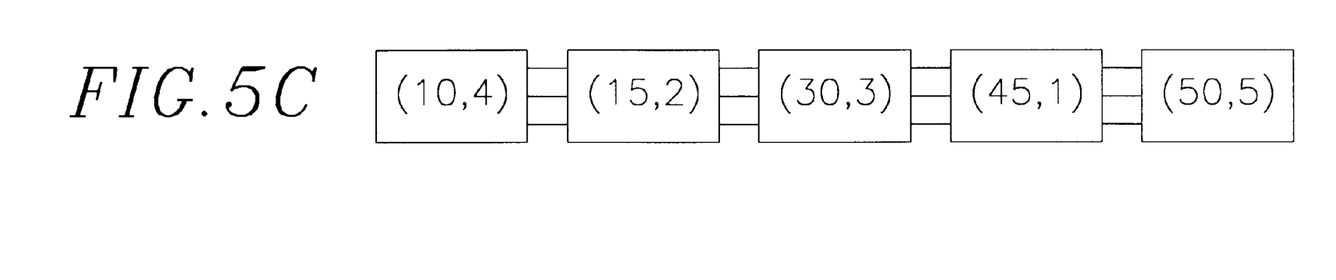

In FIG. 1, there is shown a block diagram of an apparatus 1 for median filtering a sequence of input values in accordance with the present invention, wherein input data including, for example, a pixel value of video signal, is temporarily stored in an input buffer 10 and a set of (2N+1) input data stored therein is simultaneously and directly fed to (2N+1) number of processing elements, e.g., a first processing element PE1 to a fifth element PE5 for N=2, one data to a processing element at a time, N being a positive integer and (2N+1) defining the window size of the median filter, i.e., the unit of data processing for obtaining a median value. As illustrated in FIGS. 1 and 5, only five processing elements, i.e., N=2, are used to describe preferred embodiments of the present invention, for the sake of simplicity; however, as will be appreciated by those of ordinary skill in the art, the invention is not so limited and the principles of the invention are applicable to any median filter having an odd number of processing elements.

The five processing elements PE1 to PE5 are joined in parallel to the input buffer 10 and to an initialization circuit 20, which initializes the five processing elements, and coupled in series among themselves for storing a set of 5 input values and providing a median value thereof, wherein each processing element includes a memory location and a counter.

At the outset, when only a first input value is supplied to the input buffer 10, it is preferred that the first input value is provided and stored at each of the memory locations in the 5 processing elements. The initialization circuit 20 assigns five counts 1 to 5 to the 5 counters, on a one-to-one correspondence basis, so that each of the data in a processing element includes an input value and a count. Upon the receipt of a next input value, the next input value and four current values stored in the processing elements, excluding the one associated with the count 5, are rearranged among the five processing elements in the order of their magnitude in such a manner that data including a largest input value is stored at the PE5 and a smallest at the PE1. Each count associated with each of the four current values is incremented by one and an input count associated with the next input value is set to be '1', thereby providing a new set of counts. This process will be continued until 5th input value is provided and a set of five input values is rearranged among the five processing elements in the order of their magnitude as described above.

A current value in the PE1 is smaller than or equal to a current value in the PE2, the current value in the PE2 is smaller than or equal to a current value in the PE3 and so on. Data representing an input value and a count in a processing element is transmitted to at least one nearest neighboring processing element as low data L or high data H, wherein the low and high data L and H represent data transmitted from a next lower and a next higher order processing elements, respectively, wherein PE1 is defined as a lowest order and PE5 as a highest one. As a result, at each of the processing elements, a current value stored therein is compared with a next input value simultaneously fed to all the five processing elements from the input buffer 10 and the L and H data from at least one nearest neighboring processing elements, and then one of the values compared thereat is selected and the data including the selected value is stored therein, thereby updating the current value therein.

Thereafter, a low oldest signal LO from each processing element is provided to a corresponding next higher processing element, i.e., from PE1 to PE2, from PE2 to PE3 and so on, wherein a low oldest signal LO in a processing element indicates whether or not an oldest value resides in one of its lower order processing elements. At the same time, output data including a median value is extracted from a median processing element, e.g., the third processing element PE3.

Figure 2:
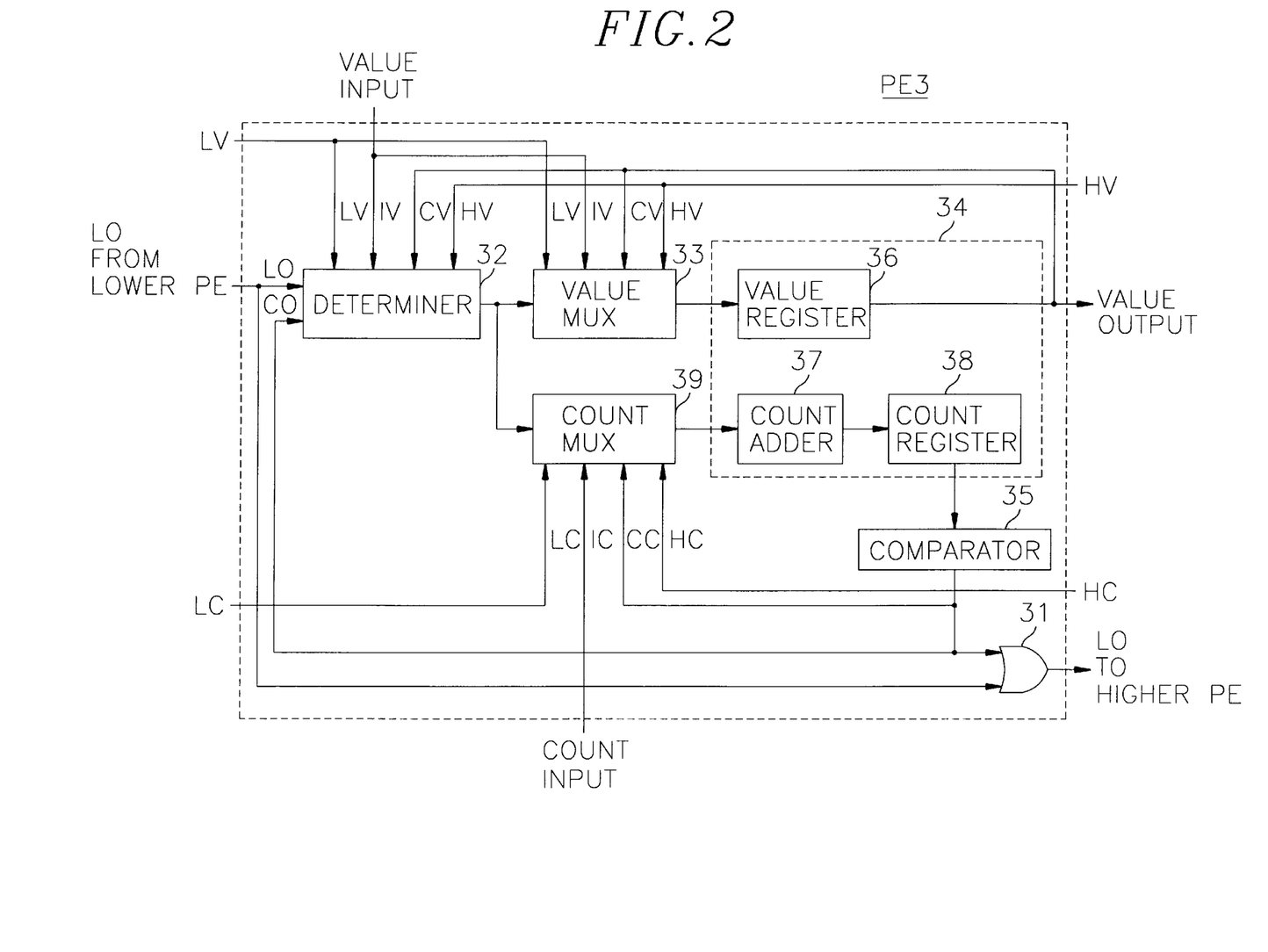
FIG. 2 provides an explanatory diagram for illustrating a processing element in FIG. 1.

As for an illustration, the third processing element PE3 of the median filter shown in FIG. 1 is described in detail in accordance with the present invention in FIG. 2. For the purpose of generalization, the third processing element PE3 is renamed as a current processing element(CURRENT PE) and its two adjacent processing elements PE2 and PE4, i.e., its respective next lower and next higher processing elements are renamed as a LOWER PE and a HIGHER PE, respectively. A low value LV from the LOWER PE, an input value IV of the input data from the input buffer 10, a current value CV from a current value register 36 included in a data register 34 of the CURRENT PE and a high value HV from the HIGHER PE are provided to a determiner 32 and a value multiplexer(VALUE MUX) 33 of the CURRENT PE. At the same time, a count LC(low count) from the LOWER PE, a count IC(input count) from count input, a count CC(current count) from a current count register 38 included in the data register 34 of the CURRENT PE and a count HC(high count) from the HIGHER PE are provided to a count multiplexer(COUNT MUX) 39 of the CURRENT PE, wherein the count IC is initialized to be "0".

A current oldest signal CO from a comparator 35 is provided to the determiner 32, wherein the current oldest signal CO indicates whether or not the CC is associated with the oldest input value or equivalently whether or not the CV is the oldest input value. If the CC is equal to a predetermined number 2N+1, i.e., the window size of the median filter (5 for N=2), the current oldest signal CO indicating the CV being the oldest input value is transmitted to the determiner 32 and an OR gate 31 of the CURRENT PE and, otherwise, the current oldest signal CO representing the CV not being the oldest input value is transmitted. The low oldest signal LO fed from the LOWER PE is also provided to the determiner 32 and the OR gate 31.

In the mean time, after the OR function is performed at the OR gate 31 on the LO from the LOWER PE and the CO from the comparator 35 of the CURRENT PE, the output of the OR gate 31 is provided to the HIGHER PE as a LO of the HIGHER PE.

In another embodiment, a CO may be fed from a CURRENT PE to all the higher processing elements of the current processing element, and, after an OR function is performed on CO's from all the lower order processing elements, the output of the OR function may be provided to a determiner as a LO of the CURRENT PE.

The determiner 32, responsive to the LO from the LOWER PE and the CO from the comparator 35, selects one value among the LV, the IV, the CV and the HV. All the values selected in this way at all the PE's will be rearranged in the order of their magnitude in the value registers of all the PE's as is subsequently described with FIG. 3.

Thereafter, the determiner 32 generates a determination signal indicating the selection to the VALUE MUX 33 and COUNT MUX 39 simultaneously. At the VALUE MUX 33, responsive to the determination signal, a value among the LV, the IV, the CV and the HV is selected and then the selected value is transmitted to the value register 34 and stored therein as an updated current value. At the COUNT MUX 39, in response to the determination signal, a count among the LC appended to the LV, the IC appended to the IV, the CC appended to the CV and the HC appended to the HV is selected and then the selected count is transmitted to a count adder 37 included in the data register 34 and increased by 1 to generate an updated current count CC. The updated current count is provided to the count register 38 and stored therein. After the CV and the CC are replaced with the updated current value and count, respectively, the updated current value and count are provided as CV and CC of the CURRENT PE, respectively, for a subsequent data entry.

In odd number of processing elements, it is preferable that a median value of data corresponding to the middle processing element is selected as an output.

Figure 3:
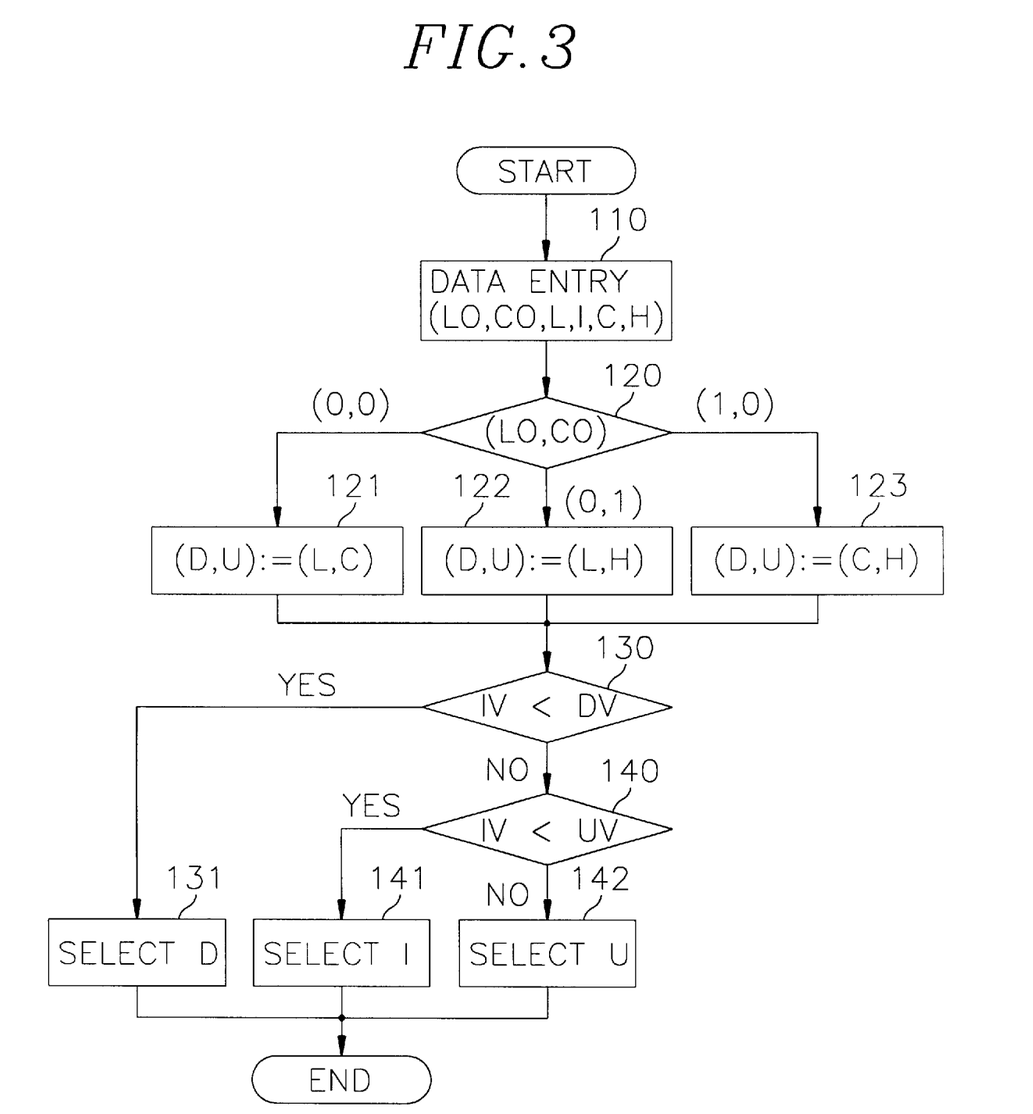
FIG. 3 shows a flow chart illustrating an operation of the determiner in FIG. 2.

Referring to FIG. 3, there is a flow chart illustrating an important aspect of the invention regarding the operation of the determiner 32 shown in FIG. 2 at a PE. At step 110, the determiner is loaded, as described above, with the LO, the CO, the low data L, the input data I, the current data C and the high data H, wherein the L represents data being transmitted from a next lower PE, the I represent data including the input value IV and input count IC, the C represents data having the current value CV and current count CC and the H represents data being transmitted from a next higher PE.

At a next step 120, the determiner detects where the oldest value exists by using the LO and the CO. If the LO and the CO are paired as a count array (LO, CO) and "0" and "1" indicate non-existence and existence of the oldest value, respectively, then a count array (0,0) indicates that none of the CURRENT PE and its lower order processing elements contain the oldest data, i.e., one of its higher order PE contains the oldest data; another count array (0,1) indicates that the CURRENT PE contains the oldest data; and yet another count array (1,0) indicates that the CURRENT PE itself has no oldest data, but one of its lower processing elements has the oldest data. Since the oldest data is excluded in the comparison process, the data to be compared with the I are selected as follows. In case of (LO,CO)=(0,0), at step 121, the L and the C are selected and are given temporal aliases D and U, respectively, for the sake of simplicity in the following description, D being a smaller one between the two; in case of (LO,CO)=(0,1), at step 122, the L and the H are selected and are similarly represented by D and U, respectively; and in case of (LO,CO)=(1,0), at step 123, the C and the H are selected and are also represented by data D and U, respectively.

After selecting the smaller and the larger data D and U in each case, wherein the data D includes its value DV and its count DC while the data U has its value UV and its count UC, at subsequent steps 130 and 140, a median value is selected among the IV of the I, the DV of the D and the UV of the U and is saved as a new current value in the PE. However, for the PE1, being the lowest order PE, there is no low data L to receive, and thus a smaller value between the IV and the UV is selected to be saved as a new current value thereat, and in case of PE5, being the highest order PE, it has no high data H to receive, a larger value between the DV and the IV is selected and saved as a new current value therein.

The selection process mentioned above is described in details hereinafter. If the IV is determined to be less than the DV at step 130, the data D is selected at step 131 to generate a D selection signal. If otherwise, the IV is compared with the UV at step 140. If the IV is less than the UV, the input data I is selected at step 141 to generate an I selection signal; and, if otherwise, the data U is selected at step 142 to generate U a selection signal. It is preferable to assign a possible minimum input value MIN to the DV on the lowest order processing element PE1 and a possible maximum input value MAX to the UV on the highest order processing element PE5.

Figure 4:
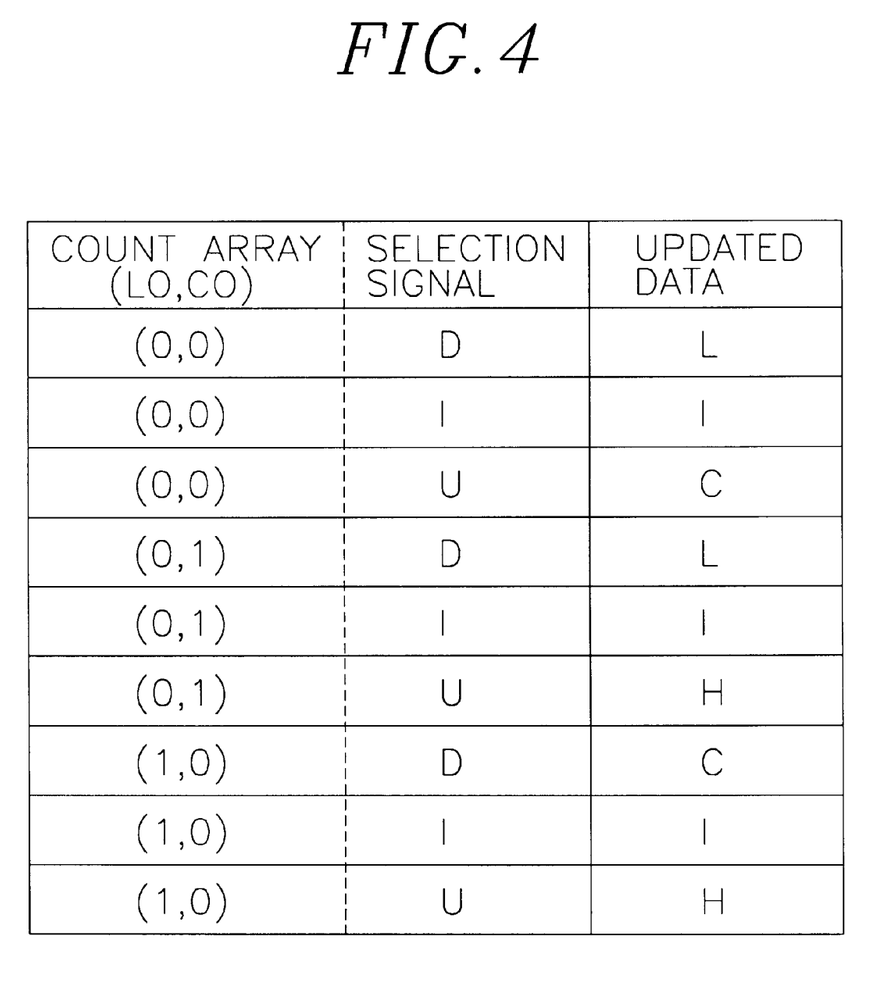
FIG. 4 illustrates the relation of count array, selection signal and the corresponding updated data.

The result is shown FIG. 4, wherein, if the count array (LO,CO)=(0,0) and the selection signal is D, the data to be updated with is the low data L; if the count array (LO,CO)=(0,0) and the selection signal is I, the data to be updated with is the input data I; if the count array (LO,CO)=(0,0) and the selection signal is U, the current data C itself is equal to data to be updated with; and so on.

Since a value held in the value register 36 shown in FIG. 2 is always associated with a count held in the count register 38 in FIG. 2, the value and the count can be paired in a data array in a form of (value, count) as shown in FIGS. 5A, 5B and 5C for further description of the algorithm of the determiner 32 shown in FIG. 2. If a number of input values, 10, 20, 30, 40 and 50, are provided in the sequence of 40, 20, 50, 10 and 30, the data arrays for the 5 PE's will be (10,2), (20,4), (30,1) (40,5) and (50,3), respectively, as shown in FIG. 5A, after the median filtering operation described above, wherein the latter numbers 2, 4, 1, 5 and 3 represent the counts of the respective values, i.e., the lapse of time after inputting of the corresponding data.

When a new input value 15 is provided with count 0, the procedures at the PE4, holding the oldest value, will proceed from step 120 to step 122 as shown in FIG. 3 with DV=LV= 30 from PE3 and UV=HV=50 from PE5. At the next step 130, since the IV=15 is smaller than the DV=LV=30, the CV at the value register thereof is updated with the DV=LV=30 at step 131 as shown in FIG. 4 and the count of the count register thereof is increased by 1 from 1 to 2. In other ward, a median value 30 of the IV=15, the LV=30 and the HV=50 is selected and stored as an updated current value of the PE4. Since a second and a third processing elements PE2 and PE3 have a count array (LO,CO)=(0,0), the procedure therein will proceed from step 120 to step 121 with (DV,UV)=(LV, CV)=(10,20) for the PE2 and (DV,UV)=(LV,CV)=(20,30) for the PE3 as discussed before in conjunction with FIG. 3. For the PE2, since DV(=10)<IV<UV(=20), the procedure will proceed from the next step 130 to step 141 via step 140, and the IV=15 is selected as a median value of the DV=LV= 10, the IV=15 and the UV=CV=20 at step 141 to update the CV at the value register thereof with an updated count 1 at the count register thereof. Similarly for the PE3, since the IV=15 is smaller than DV=LV=20, the procedure will follow from the next step 130 to step 131 and the DV=LV=20 is selected as a median value of the IV=15, the DV=LV=20 and UV=CV=30 to update the CV at the value register thereof with an updated count 5 at the count register thereof. As for PE1, being the lowest order PE, since (LO,CO)=(0,0) and CV=10 is selected as a minimum value of the CV=10 and the IV=15, the CV=10 at the value register thereof is not changed while the CC at the count register thereof is increased by 1 from 2 to 3. On the other hand, for the PE5, being the highest order PE, since (LO,CO)=(1,0) and CV=50 is selected as a maximum of the IV=15 and the CV=50, the CV=50 at the value register thereof is not changed while the CC at the count register thereof is increased by 1 from 3 to 4. The result is shown in FIG. 5B and the updated current value 20 of the third processing element PE3 will be outputted as a median value of values 10, 15, 20, 30 and 50.

When a next input value 45 is inputted with a count 0 as shown in FIG. 5B, since a current value 20 at the PE3 is the oldest, i.e, a count array (LO,CO)=(0,1), (DV,UV)=(LV, HV)=(15,30) at step 122; the CV of the value register thereof is updated with the UV=HV=30 with the CC increased by 1 from 2 to 3 at step 142 because the UV=HV=30 is a median value of the DV=LV=15, the UV=HV=30 and the IV=45. For PE4, having the count array (LO,CO)=(1,0) and therefore (DV,UV)=(CV,HV)=(30,50) at step 123, the CV of the value register thereof is updated with the IV=45 with the CC 1 at step 141 because the IV=45 is a median value of the DV=CV=30, the IV=45 and the UV=HV=50. As for the highest order PE5, having the count array (LO,CO)=(1,0), the value register with CV=50 is not changed and the CC of the count register thereof is increased by 1 from 4 to 5 because the CV=50 is a maximum value of the IV=45 and the CV=50. For the PE2, having the count array (LO,CO)= (0,0) and therefore (DV,UV)=(LV,CV)=(10,15) at step 121, the CV=15 thereof is not changed while its CC is increased by 1 from 1 to 2 at step 142 because the CV=15 is a median value of the DV=LV=10, the UP=CV=15 and the IV=45. As for the lowest order PE1, having the count array (LO,CO)= (0,0), the value register with CV=10 is not changed while the CC of its count register is increased by 1 from 3 to 4 because the CV=10 is a minimum value of the CV=10 and the IV=45. The result is shown in FIG. 5C and the updated current value 30 of the PE3 will be outputted as the median of values 10, 15, 30, 45 and 50.

While the present invention has been described with respect to the particular embodiments, it will be apparent to those skilled in the art that various changes and modifications may be made without departing from the scope and spirit of the invention as defined in the following claims.

What is claimed is:

1. A method for median filtering a sequence of input values wherein an input value is replaced by a median value for a values group which includes the input value to be replaced and N neighboring input values thereof, and the median filter includes (N+1) memory locations, N being a positive even integer, the method comprising the steps of:

(a) storing a first input value of the sequence in one of the memory locations and arbitrary values in the remaining memory locations as initial values thereof and assigning a count 1 to the first input value and counts 2 to (N+1) to the arbitrary values, respectively, thereby storing an input value and its associated count in each of the memory locations, each count representing a lapse of time after storing an associated value;

(b) receiving a next input value and determining a stored value associated with the count (N+1);

(c) arranging the next input value and the stored values other than the one associated with the count (N+1) in the order of their magnitude, thereby providing arranged values;

(d) incrementing an associated count for each of the stored values by 1 and assigning the count 1 to the next input value to thereby provide newly associated counts for the arranged values;

(e) storing the arranged values in said step (c) and their newly associated counts in the corresponding (N+1) memory locations in the order of their magnitude of the arranged values;

(f) repeating said steps (b) to (e) for the remaining input values included in the first (N+1) input values of the sequence to thereby store a first values group in the (N+1) memory locations;

(g) outputting a stored value in a predetermined memory location as a median value for the first values group;

(h) repeating said steps (b) to (e) for a next input value, thereby storing a next values group in the (N+1) memory locations;

(i) outputting a stored value in the predetermined memory location as a median value for the next values group; and (j) repeating said steps (h) and (i) for each of the subsequent input values in the sequence, wherein said step (c) includes the steps of:

(c1) comparing the next input value with the stored value associated with the count (N+1);

(c2) if the next input value is larger than or equal to the stored value associated with the count (N+1), arranging, in the order of their magnitude, the next input value and the stored values larger than or equal to the stored value associated with the count (N+1) and, if otherwise, arranging, in the order of their magnitude, the next input value and the stored values smaller than or equal to the stored value associated with the count (N+1) to thereby provide the arranged values.

2. The method according to claim 1, wherein the arbitrary values are equal to the first input value.

3. An apparatus for median filtering a sequence of input values wherein an input value is replaced by a median value for a values group which includes the input value to be replaced and N neighboring input values thereof, N being a positive even integer, the apparatus comprising:

(N+1) number of processing elements coupled in series for storing (N+1) number of input values included in a values group and providing a median value thereof, each of the processing elements having a value register for storing an input value, wherein the processing elements include a first and a (N+1)st processing elements and (N−1) number of (i)th processing elements (i=2, . . . , N), a first stored value in the first processing element being smaller than or equal to a second stored value in a second processing element and an (i)th stored value in an (i)th processing element being smaller than or equal to an (i+1)st stored value in an (i+1)st processing element and a count register for storing a count corresponding to the stored value in the value register thereof, each count representing a lapse of time after storing a corresponding stored value; and an input means for sequentially providing input values to the processing elements, an input value being provided to all the processing elements simultaneously, wherein each of the processing elements further includes;

means for determining whether said each of the processing elements, one of its lower order processing elements or one of its higher order processing elements contains a largest count to thereby generate a determination signal corresponding thereto;

means, responsive to the determination signal, for selecting one of a next input value and the stored values in said each of the processing element and its next lower and higher processing elements to thereby provide a selection signal corresponding to the selected value;

means for updating the stored value in the value register included in said each of the processing elements with the selected value;

means, in response to the selection signal, for generating, as a previous count, a zero if the selected value is the next input value and a count corresponding to the selected value if the selected value is one of the stored values in said each of the processing elements and its next lower and higher processing elements; and means for updating the previous count by adding one thereto and storing the updated count in the count register included in said each of the processing elements.

4. The apparatus according to claim 3, wherein said largest count is (N+1).

5. The apparatus according to claim 4, wherein said determining means for each of the processing elements includes:

means for comparing the count stored in the count register with a predetermined threshold (N+1) to thereby provide a comparison signal indicating whether or not the count is equal to the predetermined threshold;

means for providing a decision signal for said each of the processing elements based on the comparison signal and a decision signal from a next lower order processing element, the decision signal for each of the processing elements indicating whether or not one of said each of the processing elements and its lower order processing elements contains the count being equal to the predetermined threshold; and means for generating the determination signal based on the comparison signal and the decision signal from the next lower order processing element.

6. The apparatus according to claim 5, wherein said updating means and said means for generating the previous count are multiplexers.

7. The apparatus according to claim 6, wherein the determination signal is one of a first, a second and a third determining signals, the first determining signal indicating said each of the processing elements contains the count (N+1), the second determining signal implying that one of its lower order processing elements contains the count (N+1), and the third determining signal denoting that one of its higher order processing elements contains the count (N+1).

8. The apparatus according to claim 7, wherein said selecting means of the first processing element has means for choosing a minimum input value between the next input value and the stored value in the second processing element in response to the first determining signal and choosing a minimum value between the next input value and the stored value in the first processing element in response to the third determining signal, thereby providing the chosen minimum value as the selected value, the selecting means for an (i)th processing element has means for choosing a median value of the next input value and thei stored values in the (i−1)st and (i+1)st processing elements in response to the first determining signal, choosing a median value of the next input value and the stored values in the (i)th and the (i+1)st processing elements in response to the second determining signal and choosing a median value of the next input value and the stored values in the (i−1)st and (i)th processing elements in response to the third determining signal, thereby providing the chosen median value as the selected value, and the selecting means of the (N+1)st processing element has means for choosing a maximum value between the next input value and the stored value in the (N)th processing element in response to the first determining signal and choosing a maximum value between the next input value and the stored value in the (N+1)st processing element in response to the second determining signal, thereby providing the chosen maximum value as the selected value.

9. The apparatus according to claim 8, further comprising means for initializing the processing elements by setting a first input value and a count 1 in one of the processing elements and assigning counts two to (N+1) with arbitrary values in the remaining processing elements.

10. The apparatus according to claim 9, wherein said initializing means includes means for storing the first input value in every processing element.

11. The apparatus according to claim 8, further comprising means for initializing the processing elements by storing a preset value in a value register in every processing element and assigning counts 1 to (N+1) in the count registers of the processing elements.

12. An apparatus for median filtering a sequence of input values wherein an input value is replaced by a median value for a values group which includes the input value to be replaced and N number of its previous input values and an identical number of its subsequent input values, N being a positive integer, the apparatus comprising:

(2N+1) number of processing elements coupled in series for storing (2N+1) number of input values included in a values group in the order of their magnitude and providing a median value for the values group from an (N+1)st processing element;

an input means for sequentially providing input values to the processing elements, an input value being provided to all the processing elements simultaneously; and means for initializing the processing elements by storing a first input value of the sequence and a count 1 in one of the processing elements and arbitrary values as initial values in the remaining 2N number of processing elements and assigning counts 2 to (2N+1) thereto, each count representing a lapse of time after storing an associated value, wherein each processing element includes:

a value register for storing an input value;

a count register for storing a count appended thereto;

means for determining whether the largest count (2N+1) resides in said each processing element, one of its lower order processing elements or one of its higher order processing elements to thereby generate a determination signal representing a determination result;

means, upon receiving a next input value of the sequence, for selecting a value among the next input value of the sequence and the stored value in said each processing element and its one or two neighboring processing elements based on the determination signal to thereby update the stored value in said each processing element with the selected value; and means for updating a count appended to the selected value and storing the updated count in the count register of said each processing element, the updated count being set to 1 when the selected value is the next input value and if the selected value is one of the stored values in a processing element, the count appended to the selected value being increased by 1 and stored as the updated count.

13. The apparatus according to claim 12, wherein said determining means includes:

means for comparing the count stored in the count register with a predetermined threshold value (2N+1) to thereby provide a comparison signal indicating whether the count is equal to the threshold value;

means for providing a decision signal for said each processing element based on the comparison signal and a decision signal from its next lower order processing element, the decision signal for said each processing element indicating whether or not one of counts stored in said each and its lower order processing elements coincides with the threshold value; and means for generating the determination signal based on the comparison signal and the decision signal from the next lower order processing element.

14. The apparatus according to claim 13, wherein the determination signal is one of a first, a second and a third determining signals, the first determining signal indicating that said each processing element has the count (2N+1), the second determining signal implying that one of its lower order processing elements has the count (2N+1) and the third determining signal denoting that one of its higher order processing elements has the count (2N+1).

15. The apparatus according to claim 14, wherein said selecting means of a first processing element has means for choosing a minimum input value between the next input value and the stored value in the second processing element in response to the first determining signal and choosing a minimum value between the next input value and the stored value in the first processing element in response to the third determining signal, thereby providing the chosen minimum value as the selected value, the selecting means for an (i)th (i=2, ..., 2N) processing element has means for choosing a median value of the next input value and the stored values in the (i−1)st and (i+1)st processing elements in response to the first determining signal, choosing a median value of the next input value and the stored values in the (i)th and the (i+1)st processing elements in response to the second determining signal and choosing a median value of the next input value and the stored values in the (i−1)st and (i)th processing elements in response to the third determining signal, thereby providing the chosen median value as the selected value, and the selecting means of the (2N+1)st processing element has means for choosing a maximum value between the next input value and the stored value in the (2N)th processing element in response to the first determining signal and choosing a maximum value between the next input value and the stored value in the (2N+1)st processing element in response to the second determining signal, thereby providing the chosen maximum value as the selected value.

* * * * *